United States Patent
Horsky et al.

(10) Patent No.: US 6,922,162 B2
(45) Date of Patent: Jul. 26, 2005

(54) CURRENT SOURCE BLOCKS IN MONOTONIC PRECISE CURRENT DAC

(75) Inventors: Pavel Horsky, Brno (CZ); Ivan Koudar, Slapanice U Brna (CZ)

(73) Assignee: AMI Semiconductor Belgium BVBA, Oudenaarde (BE)

( * ) Notice: Subject to any disclaimer, the term of this patent is extended or adjusted under 35 U.S.C. 154(b) by 0 days.

(21) Appl. No.: 10/810,506

(22) Filed: Mar. 26, 2004

(65) Prior Publication Data

US 2005/0035893 A1 Feb. 17, 2005

(30) Foreign Application Priority Data

Mar. 31, 2003 (EP) .............................. 03447075

(51) Int. Cl.[7] .............................................. H03M 1/66
(52) U.S. Cl. ...................................... 341/144; 341/136
(58) Field of Search ................................ 341/144, 136, 341/154

(56) References Cited

U.S. PATENT DOCUMENTS

| | | | | |
|---|---|---|---|---|
| 4,393,370 A | * | 7/1983 | Hareyama | 341/136 |
| 5,105,193 A | * | 4/1992 | Vogt et al. | 341/154 |
| 5,254,994 A | | 10/1993 | Junkei et al. | |
| 5,327,134 A | * | 7/1994 | Nakamura et al. | 341/144 |
| 5,453,743 A | | 9/1995 | Kang | |
| 5,600,319 A | | 2/1997 | Ginetti | |
| 5,623,264 A | * | 4/1997 | Park | 341/144 |
| 5,745,064 A | * | 4/1998 | Ohya | 341/144 |
| 5,760,725 A | * | 6/1998 | Yoshida et al. | 341/144 |
| 6,160,507 A | | 12/2000 | Carbou et al. | |
| 2002/0011372 A1 | | 1/2002 | Vetea | |

FOREIGN PATENT DOCUMENTS

| EP | 0 482845 A2 | * 10/1990 |
|---|---|---|
| EP | 0 930 717 | 7/1999 |

OTHER PUBLICATIONS

Y. Nakamura et al., "A 10–bit 70 MS/s CMOS D/A Converter," IEEE 1990 Symposium on VLSI Circuits, Jun. 7, 1990, pp. 57–58.

* cited by examiner

Primary Examiner—Jean Bruner Jeanglaude
(74) Attorney, Agent, or Firm—Trop, Pruner & Hu, P.C.

(57) ABSTRACT

A two-dimensional matrix decoder of a digital-to-analog converter comprises an array of current cells, the cells having a current source means or a current divider means and a switching means, all cells being activatable in a pre-determined sequence. The matrix decoder comprises: a selection means outputting a first selection signal for selecting a cell, a cell state signaling means outputting a cell state signal determining whether a cell comes before or after the selected cell in the pre-determined sequence, and matrix logic associated with each cell for generating a control signal suitable for controlling the switching means of that cell for switching current from the current source means or current divider means of that cell to at least one of a first node or a second node, the control signal being generated depending on the first selection signal and the cell state signal.

17 Claims, 5 Drawing Sheets

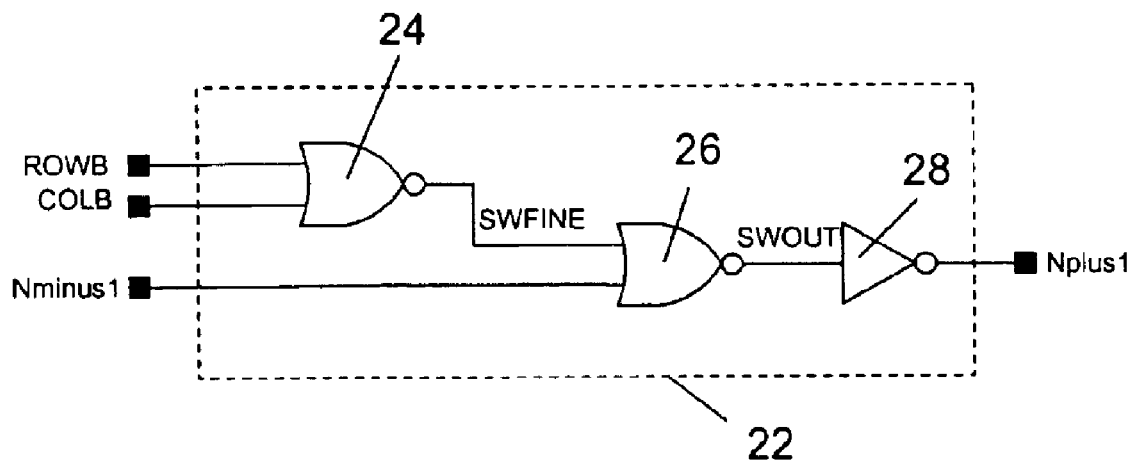
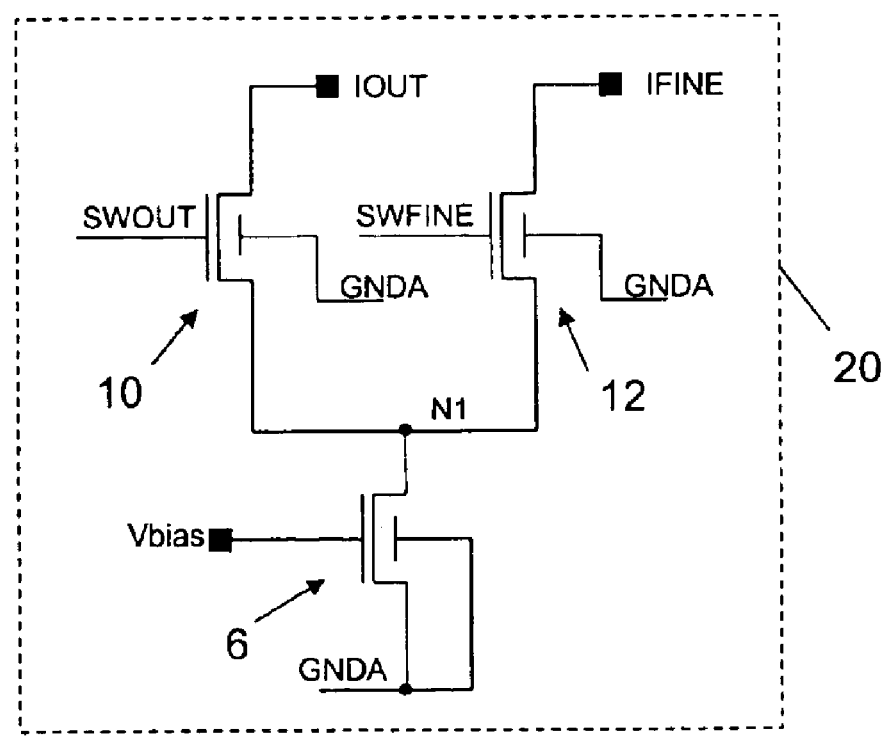
Fig. 2

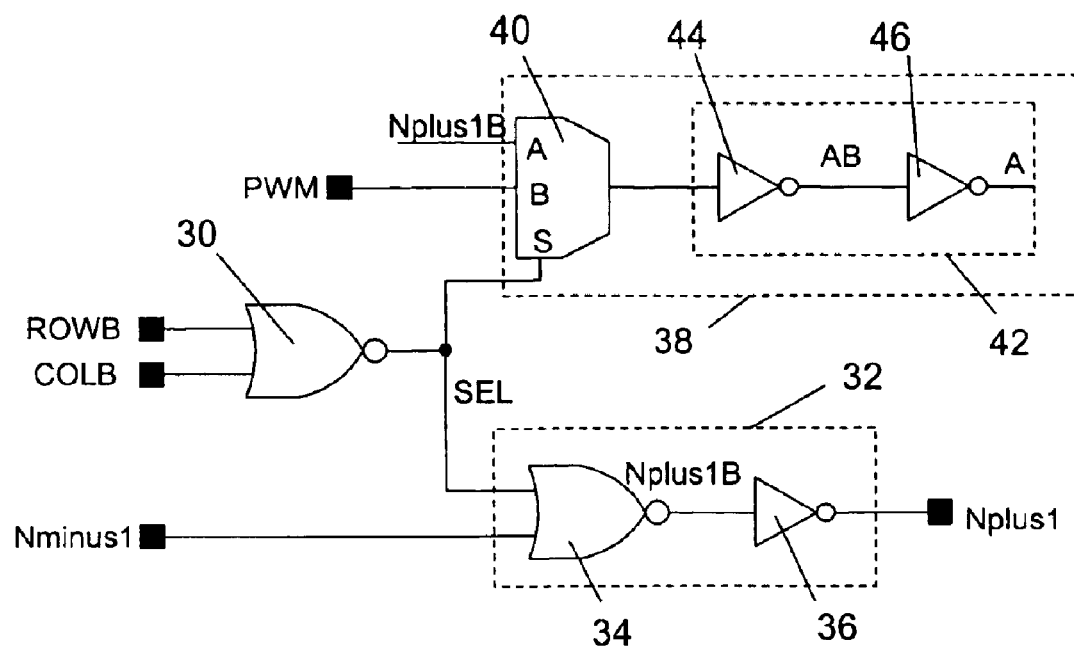
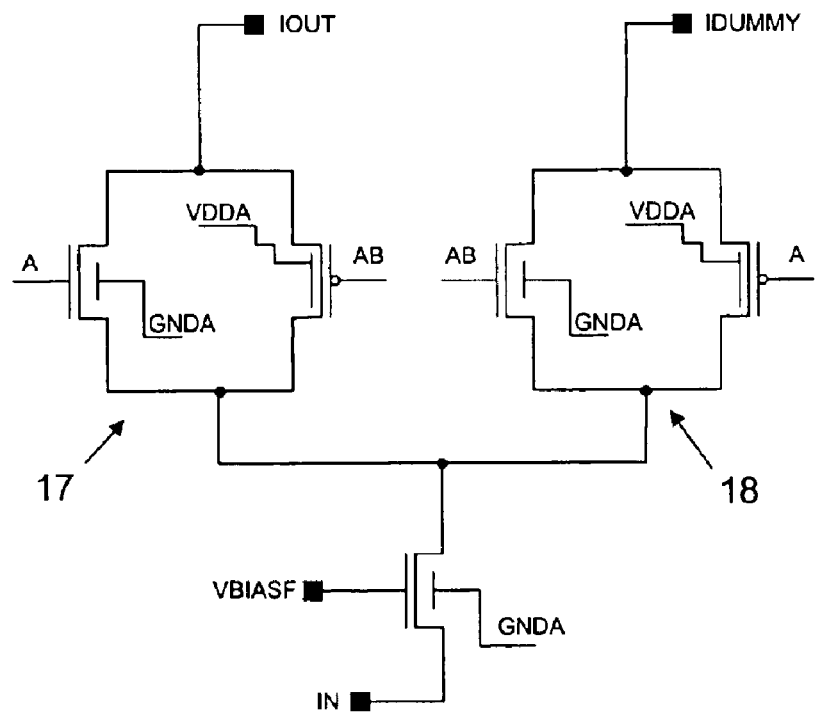
Fig. 3

Column decoder switching sequence

| 5 | 6 | 7 | 8 | 1 | 2 | 3 | 4 |
|---|---|---|---|---|---|---|---|

<table>
<tr><th rowspan="8">Row decoder switching sequence</th><th>7</th><td>53</td><td>54</td><td>55</td><td>56</td><td>49</td><td>50</td><td>51</td><td>52</td></tr>
<tr><th>5</th><td>37</td><td>38</td><td>39</td><td>40</td><td>33</td><td>34</td><td>35</td><td>36</td></tr>
<tr><th>3</th><td>21</td><td>22</td><td>23</td><td>24</td><td>17</td><td>18</td><td>19</td><td>20</td></tr>
<tr><th>1</th><td>5</td><td>6</td><td>7</td><td>8</td><td>1</td><td>2</td><td>3</td><td>4</td></tr>
<tr><th>2</th><td>13</td><td>14</td><td>15</td><td>16</td><td>9</td><td>10</td><td>11</td><td>12</td></tr>
<tr><th>4</th><td>29</td><td>30</td><td>31</td><td>32</td><td>25</td><td>26</td><td>27</td><td>28</td></tr>
<tr><th>6</th><td>45</td><td>46</td><td>47</td><td>48</td><td>41</td><td>42</td><td>43</td><td>44</td></tr>
<tr><th>8</th><td>61</td><td>62</td><td>63</td><td>64</td><td>57</td><td>58</td><td>59</td><td>60</td></tr>
</table>

Fig. 4

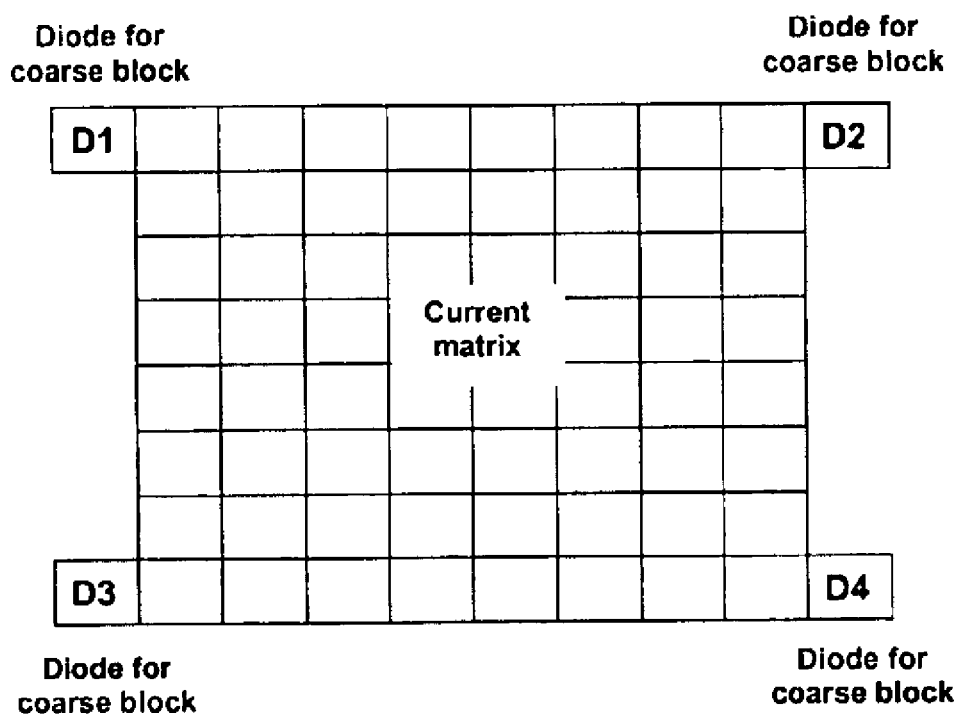

Fig. 5

CURRENT SOURCE BLOCKS IN MONOTONIC PRECISE CURRENT DAC

TECHNICAL FIELD OF THE INVENTION

The present invention relates to the implementation of current matrix blocks in a current digital-to-analog converter (DAC) as well as to methods of operating a DAC.

BACKGROUND OF THE INVENTION

A DAC is designed to convert an m-bit digital input word into a corresponding analog output signal. The DAC includes a plurality of current sources and a plurality of switching means corresponding to the current sources. Each switching means is connected to its corresponding current source and switches the current from that current source either to a first terminal, connected to a first connection line of the converter, or to a second terminal, connected to a second connection line of the converter. Each switching means receives one of a plurality of control signals and selects either its first terminal or its second terminal in accordance with the value of the control signal concerned. An output current of the DAC is the sum of the respective currents delivered to the first connection line.

It will be appreciated that the number of current sources and corresponding switching means in a DAC is quite large, particularly when the number of bits (m) of the digital input word is large, e.g. 6 or larger. Furthermore, when using linearly weighted blocks in a DAC, the number of switches is higher than for binary weighted blocks. In order to deal with such a large number of current sources, and to enable control signals to be delivered efficiently to, the switching means, it has been proposed to arrange the current sources and switching means as a two-dimensional array of cells. Each cell includes its own current source and corresponding switching means.

Several different implementations of current matrix blocks used in DACs are known.

Conventional cell array circuitry switching is such that the activation sequence generally follows the physical order of the cells in the array, starting from row 1 and activating the cells of that row sequentially in column order, followed by row 2, and so on for each successive row of the array.

Another switching order or selection sequence is, as described in U.S. Pat. No. 6,236,346, conforming to a so-called "magic square". In such cell array circuitry, the effects of graded and symmetrical errors within the cell array, are reduced.

U.S. Pat. No. 8,453,743 describes a symmetric decoding in the row direction of the cell array. This is done in order to reduce an integral non-linearity error due to gradient of the current sources in the row direction of the array.

In the above implementations, current sources in the array are either switched ON or OFF, i.e. they are either switched to the first connection of the array which is coupled an output thereof, or they are switched to the second connection, which is a ground connection.

If more signals would have to be generated for controlling the array of current cells, then for bigger size matrix this would represent a large area for the decoder itself, and also for routing from the decoder to the switches.

SUMMARY OF THE INVENTION

It is an object of the present invention to provide a matrix of cells of current sources where more than one control signal is applied to the cells, but which takes less space than would do prior art lay-outs.

The above objective is accomplished by a method and device according to the present invention.

The present invention provides a two-dimensional matrix decoder for a digital-to-analog converter comprising an array of current cells, the cells having a current source means or current divider means and a switching means, all cells being activatable in a pre-determined sequence. The matrix decoder comprises: a selection means outputting a first selection signal for selecting a cell, a cell state signaling means outputting a cell state signal determining whether a cell comes before or after the selected cell in the pre-determined sequence, and matrix logic associated with each cell for generating a control signal suitable for controlling the switching means of that cell for switching current from the current source means or current divider means of that cell to at least one of a first node or a second node, the control signal being generated depending on the first selection signal and the cell state signal.

In a matrix decoder according to the present invention, the selection means may comprise a first decoder outputting a first selection signal for selecting a first set of cells, and a second decoder outputting a second selection signal for selecting a second set of cells, the first and second set of cells having the selected cell in common.

The first decoder may be a row decoder and the first set of cells may be a row of cells. The second decoder may be a column decoder and the second set of cells may be a column of cells.

The first node to which current of the current source may be switched may be an output node of the digital-to-analog converter. The second node may be a ground node or dummy node of the digital-to-analog converter.

The matrix logic may be implemented by using negative logic, for example in case of a current sinking implementation; the matrix logic may also be implemented by using positive logic, for example in case of current sourcing implementation.

The pre-determined sequence may be such that a sequence of cells starts in the middle of the matrix and expands from the middle to the sides of the matrix.

The control signal generated by the matrix logic may be suitable for controlling the switching means of that cell for switching current to either of a first, a second or a third node. The third node may be coupled to a further matrix of current cells.

The present invention also provides a digital-to-analog converter comprising: an array of current cells, all cells being activatable in a pre-determined sequence, a current source means or current divider means and a switching means, and a matrix decoder as described above.

The present invention also provides a method for decoding a two-dimensional matrix of a digital-to-analog converter comprising an array of current cells, the cells having a current source means or current divider means and a switching means, all cells being activatable in a pre-determined sequence. The method comprises:
selecting a cell,
determining whether a cell comes before or after the selected cell in the pre-determined sequence,
controlling the switching means of the cell for switching current from the current source means or current divider means of that cell to at least one of a first node or a second node, the controlling depending on whether the cell is selected or whether it comes before or after the selected cell in the pre-determined sequence.

Selecting a cell may comprise selecting a first set of cells, and selecting a second set of cells, the first and second set of cells having the selected cell in common. Selecting a first set of cells may comprise selecting a row of cells. Selecting a second set of cells may comprise selecting a column of cells.

The pre-determined sequence may be such that a chain of cells starts in the middle of the matrix and expands from the middle to the sides of the matrix.

Controlling the switching means may comprise switching current to either of a first, a second or a third node. Switching current to the third node may comprise coupling current into a further matrix of current cells.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

BRIEF DESCRIPTION OF THE DRAWINGS

FIG. 2 illustrates an example of a current cell according to an embodiment of the present invention, suitable for a coarse block, the current cell including a decoder, a current source and switches.

FIG. 3 illustrates an example of a current cell according to an embodiment of the present invention, suitable for a fine block including PWM modulation, the current cell including a decoder, a current source and complementary switches.

FIG. 4 illustrates the switching sequence according to an embodiment of the present invention of an 8×8 matrix of current cells.

FIG. 5 shows an example of the position of reference diodes for a coarse matrix.

DESCRIPTION OF ILLUSTRATIVE EMBODIMENTS

Figure 1:
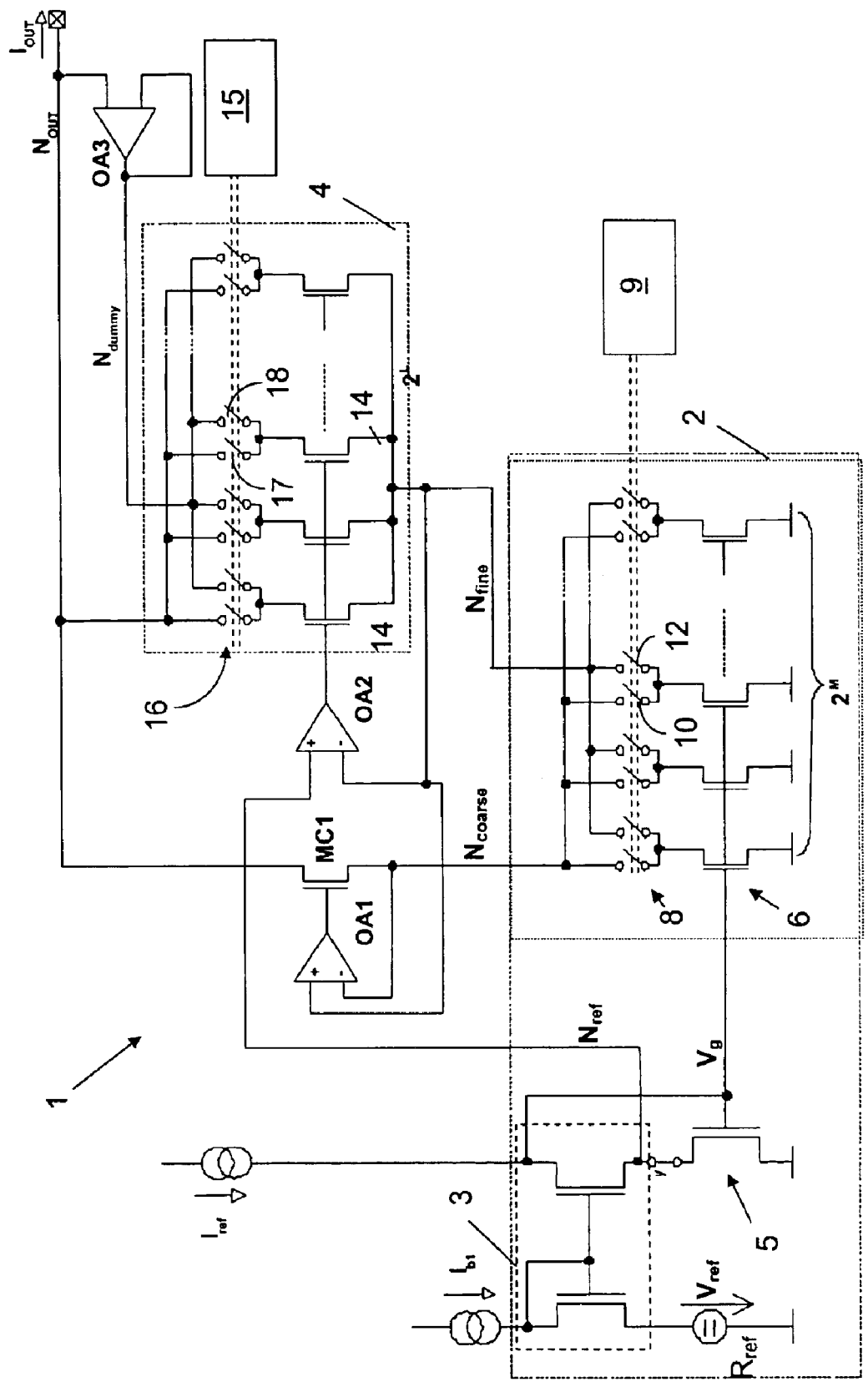
FIG. 1 is a block diagram of a current DAC.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. Thus, the scope of the expression "a device comprising means A and B" should not be limited to devices consisting only of components A and B. It means that with respect to the present invention, the only relevant components of the device are A and B.

Similarly, it is to be noticed that the term "coupled", also used in the claims, should not be interpreted as being restricted to direct connections only. Thus, the scope of the expression "a device A coupled to a device B" should not be limited to devices or systems wherein an output of device A is directly connected to an input of device B. It means that there exists a path between an output of A and an input of B which may be a path including other devices or means.

The diagram of FIG. 1 shows the principles of a DAC 1. This DAC 1 is a current DAC, i.e. it utilises current sources controlled by a digital input signal value which is being converted into an analog equivalent. The output of the DAC 1 is a current signal.

The DAC 1 is a segmented or dual DAC for conversion of a digital word or signal having a number of bits into an analog value. As a first embodiment, a DAC 1 for converting a digital word having M+L bits is considered.

At the left hand side of FIG. 1, a reference voltage $V_{ref}$, for example 0.5 Volts, is generated, for example by a current $I_{b1}$ which is sent through a reference resistor $R_{ref}$. The current $I_{b1}$ is chosen proportional to the value of the resistance $R_{ref}$, and therefore is preferably generated on-chip. As the current $I_{b1}$ is only used for generating the reference voltage $V_{ref}$, it does not need to be highly accurate. Instead of a current flowing to a reference resistor $R_{ref}$, any voltage source can be used for $V_{ref}$.

It is tried to keep the same voltage $V_{ref}$ at node $N_{ref}$ by means of a source follower circuit 3, comprising an input transistor and an output transistor. At the side of the output transistor of the source follower circuit 3, a reference input current $I_{ref}$ flows through a diode 5. This diode 5 may comprise a number of transistors, e.g. eight transistors. $I_{ref}$ is proportional to the number of transistors in the diode 5. The overall precision of the DAC depends on this current $I_{ref}$, therefore this current $I_{ref}$ needs to be very precise. At the gate of the transistors in the diode 5, a voltage $V_G$ is generated. The gates of the transistors of the diode 5 are connected to the drain of the output transistor of the source follower circuit 3 in order to provide a low voltage drop circuit. A conventional current mirror, without connection between the gates of the transistors of the diode 5 and the drain of the output transistor of the source follower circuit 3, may also be used, but in that case another output voltage range is obtained.

A first block, a coarse block 2, provides a coarse conversion of a part of the input digital signal by means of switching means, such as e.g. switching transistors, controlled by a decoder decoding the M most significant bits of the digital signal having M+L bits. A second block, a fine block 4, provides a fine conversion in response to the L least significant bits of the digital signal. The use of a coarse (M-bit) converter cascaded with a fine (L-bit) converter instead of one single N-bit converter block (wherein N=M+L) produces a very great saving in the number of devices which are required for the conversion, and accordingly a very great saving in the area of the converter.

Coarse block 2 comprises a number of current sources 6. If the course block 2 is provided for conversion of M bits of the incoming digital signal, then it comprises $2^M$ current sources 6; for example for conversion of a 7-bits signal, 128 current sources are needed. In the embodiment described with respect to FIG. 1, the current sources 6 are transistors, the gates of which are connected to the gates of the transistors forming the diode 5. The current sources are formed as linearly weighted, low voltage drop, current mirrors. This decreases matching requirements for the transistors forming the current sources 6. The currents delivered by the current sources 6 of the coarse block 2 are thus substantially equal to each other. By providing current sources 6 which each provide substantially the same amount of current and controlling these currents by a thermometer signal, a monotonic converter is provided. Linearly weighted converters require more switches and/or more current sources than binary weighted converters (wherein each current source provides a different amount of current, each value being a binary two multiple) to implement the same resolution. However, monotonic converters are characterised by the fact that, when increasing input signal values are applied to the converter, the output never decreases in value. Although binary weighted converters can be monotonic if a high enough precision of the current sources is provided, they are often not monotonic due to errors in precisely implementing each current source value. To create a monotonic binary weighted converter requires high accuracy for all current sources mainly for higher number of bits, on the other hand a linearly weighted converter is intrinsically monotonic. In coarse block 2 as shown in FIG. 1, the reference current $I_{ref}$ is mirrored to each of the current sources 6, which each deliver a current $I_{ref}$, or a part or a multiple thereof, depending on the number and the dimensions of the transistors forming the current sources 6.

Coarse block 2 furthermore comprises a number of switching devices 8. On the outputs of the current sources 6 of the coarse block 2, two way switches 8 are used, according to one embodiment, as represented in FIG. 1. Such two way switch 8 provides two ways in which the current can flow, and one open state. Therefore, each two way switch 8 comprises two switches 10, 12.

A first switch 10 is controlled by a thermometer code delivered by a binary-to-thermometer converter part of a converting means 9. A binary-to-thermometer converter has a data input for receiving M bits of the digital input signal to be converted into an analog signal, where M is an integer. The M bits represent the most significant bits of the digital input signal which is desired to be converted to an equivalent analog value. The binary-to-thermometer converter provides a conventional conversion from binary code to thermometer code. For facilitating the understanding of such converter, an example of the conventional binary-to-thermometer code conversion is provided in table 1 for three input bits (M=3).

TABLE 1

| Binary input | Thermometer output | Code 1 of Nc |
|---|---|---|
| 000 | 00000000 | 00000001 |
| 001 | 00000001 | 00000010 |
| 010 | 00000011 | 00000100 |
| 011 | 00000111 | 00001000 |
| 100 | 00001111 | 00010000 |
| 101 | 00011111 | 00100000 |
| 110 | 00111111 | 01000000 |
| 111 | 01111111 | 10000000 |

For an M-bit input word, $2^M-1$ thermometer coded signals are required, for example for a 3-bit input word, 7 thermometer coded signals are required. A binary-to-thermometer encoder is such that the number of bits turned on at its output is the same as the numeric value presented at its input.

The first switches 10 thus switch current from activated current sources 6 through cascode transistor MC1 to an output node $N_{OUT}$.

A first switch 10 is controlled by a thermometer code delivered by a binary-to-thermometer converter part of a first converting means 9. A second switch 12 of the two way switches 8 is controlled by a code 1 of Nc, Nc being the number of coarse currents (Nc=$2^M$), which code is delivered by a binary-to-1-of-N converter which may also be, but does not need to be, part of the first converting means 9. The code 1 of Nc is illustrated in table 1 hereinabove in case of a 3-bit digital input signal. The second switches 12 switch the current of the first unselected current source of the coarse block 2 so as to flow into the fine block 4. Other unselected current sources may be switched off to decrease current consumption.

Very careful routing of the ground node is needed to guarantee negligible ground shifts in the coarse current mirror. If not, the sources of different transistors forming the current sources 6 are at a different voltage level, and the current sources 6 will not deliver a same current as expected. When switching between coarse bits, the ground shifts will change (due to change of the current flowing through the ground connection) and monotonicity of the converter can be lost.

Alternatively, three way switches (not represented in the drawings) can also be used to improve accuracy. In that case, each three-way switch comprises a first, a second and a third switch. The first switch switches selected or activated current sources 6 to the output node, the second switch switches the current of the first unselected current source 6 to the fine block 4, and the third switch switches non-activated current sources 6 of the coarse block 2 to the supply, or preferably to a level substantially equal to $V_{ref}$. By switching current sources off instead of letting the current flow to a voltage level such as the supply or $V_{ref}$, current consumption is saved. However, if the current sources 6 are switched off and need to be switched on at a certain moment in time, more time is needed to settle the DAC 1 because it is needed to charge the drains of the transistors forming said current sources 6 and monotonicity could be influenced.

The output of the first unselected coarse bit is connected to the fine block 4, where the current is further divided by current division means, e.g. by means of current dividing transistors. When the DAC digital input signal is increased in such a way that the coarse bit value is increased by one, then the coarse bit, which was previously connected to fine bits input node $N_{fine}$ is now added to the other selected outputs on the output node $N_{coarse}$ and goes to the output via cascode MC1. The next coarse current source is taken as an input for the fine bits on node $N_{fine}$.

The fine block 4 is constructed as a linearly weighted current divider. This means that current coming in from the coarse block 2 is equally divided e.g. by current dividing transistors, over the different branches 14 in the fine block 4. This principle makes the current DAC intrinsically monotonic. Each branch 14 of the fine block 4 is again provided with switching means, for example with two way switches 16. The two way switches 16 comprise a first switch 17 for switching the current of the corresponding current source to the output node $N_{OUT}$, and a second switch 18 for switching the current of the corresponding current source to a dummy node $N_{dummy}$.

The L least significant bits of the digital input signal are again thermometer coded in a binary-to-thermometer converter part of a second converting means 15 to provide a control signal for controlling the first switch 17 of the two way switches 16, as illustrated in table 2 below for a 3-bit input signal. The second switches 18 are controlled by an inverted converter which may also be part of the second converting means 15. This inverted converter outputs a control signal which is the inverse of the control signal outputted by the binary-to-thermometer converter, i.e. current from current sources not flowing to the output node $N_{OUT}$ is flowing to the dummy node $N_{dummy}$.

TABLE 2

| Binary input | Thermometer output | Inversion |
|---|---|---|
| 000 | 0000000 | 1111111 |
| 001 | 0000001 | 1111110 |
| 010 | 0000011 | 1111100 |
| 011 | 0000111 | 1111000 |
| 100 | 0001111 | 1110000 |
| 101 | 0011111 | 1100000 |
| 110 | 0111111 | 1000000 |
| 111 | 1111111 | 0000000 |

For the fine block 4, if L least significant bits are to be coded, for the present embodiment $2^L-1$ current sources are needed, for example for a 3-bit digital input, 7 current sources are needed.

The switches 16 are used to connect the output of the fine block current dividers to output node $N_{OUT}$ or to connect them to a dummy branch $N_{dummy}$ where the current may be dumped.

According to a second embodiment, pulse width modulation (PWM) can be applied to the first unselected fine current source in order to increase or enhance resolution while substantially keeping the same number of current sources and switches, i.e. by substantially the same number of transistors. In fact, only a control signal and decoder (and one or more switches) are needed in the fine conversion block compared to the first embodiment as explained above. In case PWM may be applied, the digital signal coming in comprises at least M+L+K bits, whereby the M more significant bits are used for controlling the switches of the coarse conversion block, L less significant bits are used for controlling the switches of the fine conversion block, and the K least significant bits are used for controlling the PWM. The controlling of the switches of the coarse conversion block 2 and of the fine conversion block 4 is done as described in the first embodiment above, and is therefore not repeated in detail here.

The L least significant bits of the digital input signal are again thermometer coded in a binary-to-thermometer converter part of a second converting means 15 to provide a control signal for controlling the first switch 17 of the two way switches 16, as illustrated in the table below for a 3-bit input signal. The second switches 18 are controlled by an inverted converter part of the second converting means 15. This inverted converter outputs a control signal which is the inverse of the control signal outputted by the binary-to-thermometer converter, i.e. current from current sources not flowing to the output node $N_{OUT}$ is flowing to the dummy node $N_{dummy}$.

TABLE 3

| Binary input | Thermometer output | Inversion | Bit for applying PWM |
|---|---|---|---|
| 000 | 00000000 | 11111111 | 00000001 |
| 001 | 00000001 | 11111110 | 00000010 |
| 010 | 00000011 | 11111100 | 00000100 |
| 011 | 00000111 | 11111000 | 00001000 |
| 100 | 00001111 | 11110000 | 00010000 |
| 101 | 00011111 | 11100000 | 00100000 |
| 110 | 00111111 | 11000000 | 01000000 |
| 111 | 01111111 | 10000000 | 10000000 |

For the fine block, if L least significant bits are to be coded, for the present embodiment $2^L$ current sources are needed, for example for a 3-bit digital input, 8 current sources are needed.

For the PWM, a modulation is applied to the first unselected current source of the fine block 4. For example, if there are K least significant bits in the digital input signal, which K least significant bits are used for applying the PWM, then the switches of the first unselected current source of the fine block are controlled so that current flows to the output node for $$\frac{X}{2^K}$$

of a time period, X depending on the value of the K least significant bits used for applying PWM. As an example, it is considered that 2 least significant bits of the digital input signal are used for applying PWM. In that case, depending on the value of those 2 least significant bits, the output of the PWM is as follows, i.e. the current of the first unselected current source is switched to the output node $N_{OUT}$ as shown in Table 4:

TABLE 4

| Binary input | PWM |
|---|---|
| 00 | 0 |
| 01 | ¼ |

TABLE 4-continued

| Binary input | PWM |
|---|---|
| 10 | 2/4 |
| 11 | 3/4 |

This means that, if the binary input is e.g. 01, the current of the first unselected current source is switched for 1/4 of a period to the output node $N_{OUT}$, and for 3/4 of a period to the dummy node $N_{dummy}$. If the PWM code, i.e. the value of the K least significant bits, is increased, this corresponds to switching the current of the first unselected current source to the output node $N_{OUT}$ for a longer time.

Applying PWM results in an output signal which has a DC value which has, at certain moments in time, a step on it. It is clear that, after filtering, the mean value of the analog output signal has risen.

According to a further embodiment, not represented in the drawings, current from the first unselected fine current source in the fine conversion block is fed to a current divider of a further, still finer, conversion block. PWM may then for example be applied to an unselected current source of this finer conversion block. The bits of the incoming digital signal need then be divided so that a part of them control the switches of the coarse conversion block, another part control the switches of the fine conversion block, another part control the switches of the finer conversion block and still another part controls the PWM means.

A problem with the implementation of decoders for the coarse block current source matrix is that thermometer coded signals are needed to control the first switches (the switches connected to the $N_{coarse}$ node and coupling current), and that a signal 1 of Nc is needed to control the second switches (switches connected to the $N_{fine}$ node and coupling current into the fine block). It is not easy to generate these signals, mainly for bigger size matrixes. For example for a seven bit coarse block, it would mean twice 128 outputs, which represents large area for the decoder itself, as well as for the routing from the decoder to the switches.

The same problem occurs for the fine block decoders, where PWM modulation may be applied to the first unselected fine bit. Again thermometer coded signals are needed to control switches for connecting their output to the output node $N_{OUT}$ of the converter, and a signal 1 of Nf, Nf being the number of fine bits, is needed to enable PWM on the last selected fine bit. All other outputs of the fine block current divider should be connected to a dummy node $N_{dummy}$.

Figure 6:
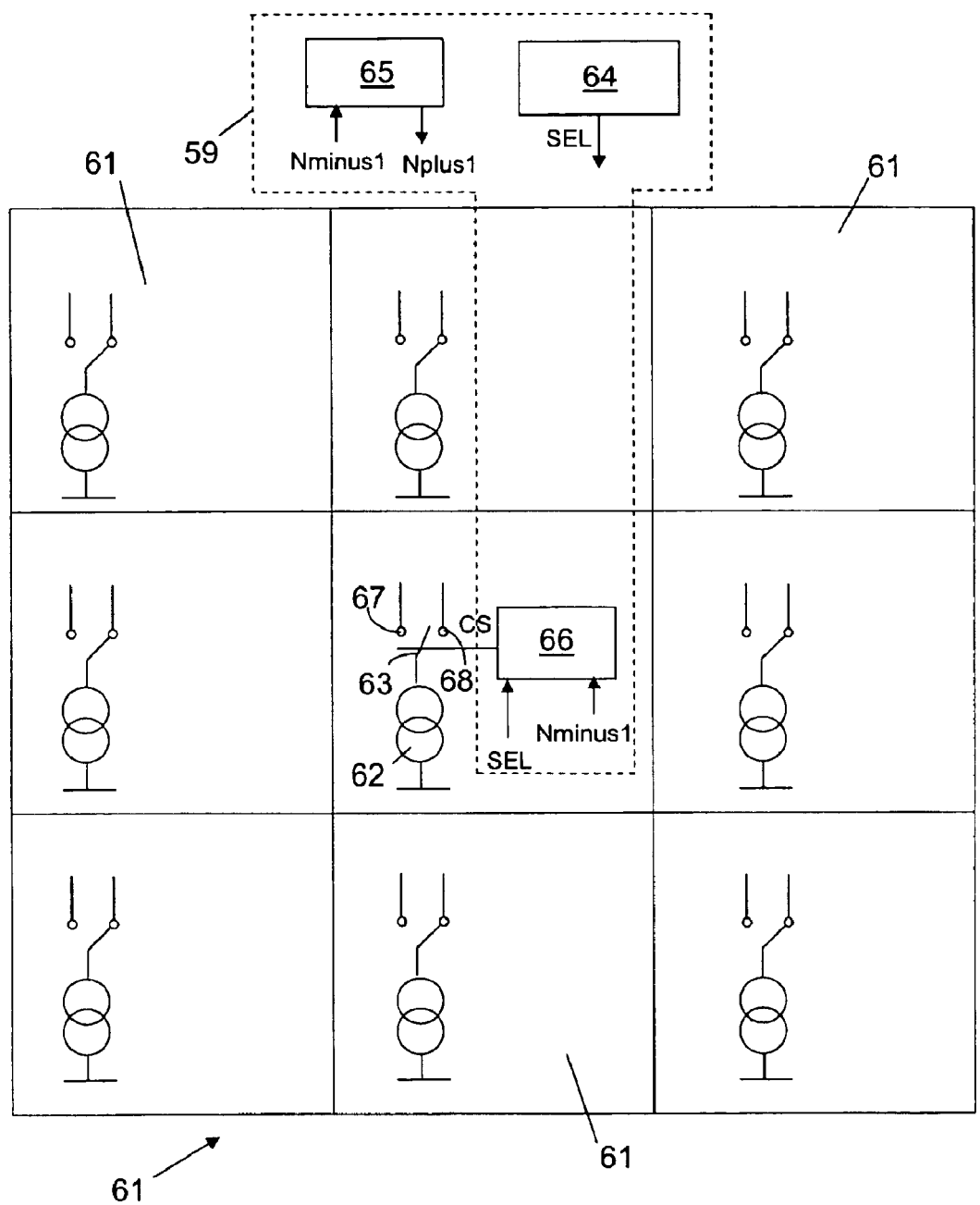
FIG. 6 illustrates a two-dimensional matrix decoder according to an embodiment of the present invention.

The present invention provides, as illustrated in FIG. 6, a two-dimensional matrix decoder 59 of a digital-to-analog converter comprising an array 60 of current cells 61, the cells 61 having a current source means 62 (for a coarse block) or a current divider means (for a fine block) and a switching means 63. All cells 61 are activatable in a pre-determined sequence. The matrix decoder 59 comprises a selection means 64 which outputs a first selection signal SEL for selecting a particular cell. The matrix decoder 59 also comprises a cell state signaling means 65 which outputs a cell state signal N determining whether a cell comes before or after the selected cell in the pre-determined sequence. Furthermore, the matrix decoder 59 comprises matrix logic 66 associated with each cell 61 for generating a control signal CS suitable for controlling the switching means 63 of that cell 61 for switching current from the current source means 62 of that cell 61 to at least one of a first node 67 or a second node 68. The control signal CS is generated depending on the first selection signal SEL and the cell state signal N. More particularly, the control signal CS may be generated depending on the first selection signal SEL and the cell state signal Nminus1 of a previous current cell in the pre-determined sequence.

According to an aspect of the present invention, a matrix structure of the current sources is used having row and column decoders, inside matrix logic and a signal reporting the status of a previous cell to a next cell. This significantly simplifies the logic needed and saves lay-out area. In the layout, switching sequence of the matrix is implemented from the center, with a compromise between complexity of the decoders and routing used, and optimum switching sequence to obtain the best accuracy.

All cells in the array or matrix of current cells are activatable or switchable in a pre-determined sequence. All cells from the beginning, the first one in the sequence, up to a selected cell are connected to the output through cascode MC1, i.e. all these cells are in the ON state. The selected cell is connected to the input of the fine block, and cells coming after the selected cell are switched off.

An example of an implementation is described hereinafter. Row and column decoders are constructed as decoders 1 of N with negative logic output. Negative logic is used to simplify implementation of the inside matrix logic, but other logic could be used as well for the implementation.

An example of a current cell 20 for a coarse block including inside matrix logic 22 is shown in FIG. 2. Selection of a current cell in the coarse conversion block 2 is done by row selection signal ROW and a column selection signal COL, both having for example a first binary value, e.g. high or one when a current cell is selected for flowing current to the current divider of the fine conversion block 4. An inverse row selection signal ROWB and an inverse column selection signal COLB are applied to the input terminals of the inside cell selection decoder 24, for example a first NOR-gate of the inside matrix logic 22.

If both the row and the column of the present current cell are unselected, i.e. the row selection signal ROW and the column selection signal COL have a second binary value, e.g. low or zero, and thus the inverse row selection signal ROWB and the inverse column selection signal COLB have the first binary value, e.g. high or one, then the output signal SWFINE of the cell selection decoder 24, e.g. the first NOR-gate, has the second binary value, e.g. low or zero. This means that the output signal SWFINE of the cell selection decoder 24, e.g. the first NOR-gate, has the second binary value, e.g. low or zero, if the present cell is not the selected cell.

If the present cell is located at the same row as the selected cell, or at the same column, but is not the selected cell, then either of the column selection signal COL or row selection signal ROW has the first binary value, e.g. high or one, while the other selection signal has the second binary value, e.g. low or zero. The inverse column selection signal COLB and the inverse row selection signal ROWB are applied to the input terminals of the cell selection decoder 24, which means that one signal having the first binary value and one signal having the second binary value are applied. The output signal SWFINE of the cell selection decoder 24, e.g. the first NOR-gate has the second binary value, e.g. low or zero.

If the present current cell is the selected cell (i.e. both of the row selection signal ROW and column selection signal COL are at the first binary value, e.g. high or one, and thus the inverse row selection signal ROWB and the inverse column selection signal COLB are at the second binary value, e.g. low or zero), then the output signal SWFINE of the cell selection decoder 24, e.g. the first NOR-gate, is at the first binary value, e.g. high or one.

The output signal SWFINE of the cell selection decoder 24, e.g. the first NOR-gate, is fed to a first input terminal of a switch selecting decoder 26, e.g. a second NOR-gate. A cell state signal Nminus1 of a previous cell is fed to a second input terminal of the switch selecting decoder 26, e.g. the second NOR-gate. The cell state signal Nminus1 of a previous cell has the second binary value, e.g. low or zero (when using opposite type of logic, e.g. at the PMOS side matrix, an opposite value can be used), at the beginning of the matrix, and propagates through the matrix as this second binary value. The output terminal of the switch selecting decoder 26, e.g. the second NOR-gate, carries a signal SWOUT. If the previous cell was before a selected cell (Nminus1 has the second binary value), and the present cell is a non-selected cell (SWFINE has the second binary value), then the output SWOUT of the switch selecting decoder 26 has the first binary value, e.g. high or one. If the previous cell was before a selected cell (Nminus1 has the second binary value), and the present cell is a selected cell (SWFINE has the first binary value), then the output SWOUT of the switch selecting decoder 26 has the second binary value, e.g. low or zero. If the previous cell was a selected cell (Nminus1 has the first binary value), and the present cell is an unselected cell (SWFINE has the second binary value), then the output SWOUT of the switch selecting decoder 26 has the second binary value, e.g. low or zero.

The output SWOUT of the switch selecting decoder 26 if fed to an input terminal of an inverter 28, which delivers at its output terminal a signal Nplus1, being the cell state signal of the next cell.

If the output signal of the switch selecting decoder 26, e.g. the second NOR-gate, carries the first binary value, i.e. e.g. high or one, which means that the present current cell comes before the selected cell in the pre-determined activation sequence, then the switching means 8 is such that current from the current source 6 of the present cell is coupled to the output node of the DAC 1. The cell state signal Nplus1 has the second binary value, e.g. low or zero, until the selected cell is reached.

At the selected cell (both the row selection signal ROW and the column selection signal COL having the first binary value, e.g. high or one, and thus the inverse row selection signal ROWB and the inverse column selection signal COLB having the second binary value, e.g. low or zero), the output signal SWFINE of the cell selection decoder 24 has the first binary value, e.g. high or one. This closes the switch 12, so that current from current source 6 of the selected cell flows to the node $N_{fine}$. The output signal SWOUT of the switch selection decoder 26, e.g. the second NOR-gate, has the second binary value, e.g. low or zero, and the cell state signal Nplus1 has the first binary value, e.g. high or one. The current source 6 of this selected cell is connected to the node $N_{fine}$, so that current from the current source 6 in the selected cell flows into the fine current dividing block.

For all cells following the selected cell, either the row selection signal ROW or the column selection signal COL or both have the second binary value, e.g. low or zero, and thus the inverse row selection signal ROWB or the inverse column selection signal COLB or both have the first binary value, e.g. high or one. This means that the output signal SWFINE of the cell selection decoder 24 has the second binary value, e.g. low or zero, and the second switch 12 is open, thus no current from the current source 6 of the present cell is fed to the node $N_{fine}$. Furthermore, the cell state signal Nminus1 for cells after the selected cell has the first binary value, e.g. high or one, which means that current from the current source 6 of the present current cell is not switched to the node $N_{OUT}$ neither, as the output signal SWIOUT of the switch selection decoder 26 has the second binary value, e.g. low or zero.

The following table shows an example of signals and states of switches 10 and 12 for 4 current cells where the cell 3 is selected.

TABLE 5

|  | Cell | | | |
| --- | --- | --- | --- | --- |
|  | 1 | 2 | 3 | 4 |
| Selected | No | No | Yes | No |
| Nminus1 | 0 | 0 | 0 | 1 |
| Nplus1 | 0 | 0 | 1 | 1 |
| SWFINE | 0 | 0 | 1 | 0 |
| SWOUT | 1 | 1 | 0 | 0 |
| 10 | ON | ON | OFF | OFF |
| 11 | OFF | OFF | ON | OFF |

An example of a current cell for a fine conversion block 4 including inside matrix logic is shown in FIG. 3. A cell selection decoder 30 has as input an inverse row selection signal ROWB and an inverse column selection signal COLB, and as output a cell selection signal SEL. If a row on which the cell is located in the matrix is unselected, the row selection signal ROW has the second binary value, e.g. low or zero, and the inverse row selection signal ROWB has the first binary value, e.g. high or one. If the row is selected, the row selection signal ROW has the first binary value, e.g. high or one, and the inverse row selection signal ROWB has the second binary value, e.g. low or zero. If a column on which the cell is located in the matrix is unselected, the column selection signal COL has the second binary value, e.g. low or zero, and the inverse column selection signal COLB has the first binary value, e.g. high or one. If the column is selected, the column selection signal COL has the first binary value, e.g. high or zero, and the inverse column selection signal COLB has the second binary value, e.g. low or zero. If the cell considered is a selected cell, i.e. both the row and the column on which it is located in the matrix are selected, then the inverse row selection signal ROWB and the inverse column selection signal COLB both have the second binary value, e.g. low or zero, and then the output signal SEL of the cell selection decoder 30 indicates that this is the selected cell, e.g. by means of the first binary value, e.g. high or one, otherwise the output signal SEL of the cell selection decoder 30 indicates that the cell is not the selected cell, e.g. by means of the second binary value, e.g. low or zero. The cell selection decoder 30 may for example be a first NOR-gate.

The output signal SEL of the cell selection decoder 30, is fed to a first input terminal of a cell state decoder 32. A cell state signal Nminus1 of a previous cell is fed to a second input terminal of the cell state decoder 32. The cell state signal Nminus1 of a previous cell has the second binary value, e.g. low or zero, at the beginning of the matrix (opposite logic can also be used), and propagates through the matrix as this second binary value, until it reaches the selected cell where it is changed to the first binary value, e.g. high or one. The output terminal of the cell state decoder 32 carries a signal Nplus1 which corresponds to the cell state signal of the next cell. The cell state decoder 32 may for example comprise a second NOR-gate 34 having a first and a second input terminal and an output terminal, coupled in series with a first inverter 36, whereby the output terminal of the second NOR-gate 34 is coupled to the input terminal of the first inverter 36. The two input terminals of the cell state decoder 32 correspond to the input terminals of the second NOR-gate 34, and the output terminal of the cell state decoder 32 corresponds to the output terminal of the first inverter 36. The signal at the output of the second NOR-gate 34 corresponds to the inverse Nplus1B of the cell state signal Nplus1 of the next cell.

The inverse Nplus1B of the output signal Nplus1 of the cell state decoder 32 is coupled to an input terminal of a switch activation decoder 38. A multiplexing device (MUX) 40 in the switch activation decoder 38 looks at whether or not the present cell is a selected cell. To this end it receives the cell selection signal SEL. If the present cell is not selected, then depending on the value of the inverse Nplus1B of the output signal Nplus1 of the cell state decoder 32, either a current output switch 17 is activated, or a current dump switch 18 is activated. For example for all unselected cells at the beginning of the matrix, the inverse Nplus1B of the cell state signal of the next cell has the first binary value, e.g. high or one, and this activates the current output switch so that a current IOUT is coupled to the output of the DAC 1. For all unselected cells at the end of the chain, the inverse Nplus1B of the cell state signal of the next cell has the first binary value, e.g. low or zero, which deactivates the IOUT switch 17 and activates the current dump switch 18, such that current from the current source is dumped to the dummy node $N_{dummy}$. For the selected cell, the switch activation decoder 38 may connect a PWM input signal, e.g. directly through a multiplexing device (MUX) 40, to drive the switches 17, 18 and the PWM modulation controls the output current of this cell. Alternatively, instead of the PWM input signal, the inverse row selection signal ROWB and/or the inverse column selection signal COLB may be changed, but this solution is very slow.

The switch activation decoder 38 may comprise a buffering stage 42, for example comprising two series coupled inverters 44, 46 for buffering the output of the multiplexing device 40, in order to obtain a same slope for signals switching from the first binary value to the second binary value as for signals switching from the second binary value to the first binary value. This is important e.g. when using complementary switches (as shown in FIG. 3) to compensate clock feed through. The following table shows an example of signals and states of switches 17 and 18 for 4 current cells where the cell 3 is selected. PWMB means inverted PWM signal.

TABLE 6

|  | Cell | | | |
| --- | --- | --- | --- | --- |
|  | 1 | 2 | 3 | 4 |
| Selected | No | No | Yes | No |
| Nminus1 | 0 | 0 | 0 | 1 |
| Nplus1 | 0 | 0 | 1 | 1 |
| SEL | 0 | 0 | 1 | 0 |
| Nplus1B | 1 | 1 | 0 | 0 |
| 17 | ON | ON | PWM | OFF |
| 18 | OFF | OFF | PWMB | ON |

A layout implementation for achieving good matching results of current sources is illustrated in FIG. 4, for an example of an 8×8-size matrix. The chain of the cells starts in the middle of the matrix and expands from the middle to the sides of the matrix. The chain of cells starts in a middle of a row, fills that row to an end, and then fills the remaining part of that row, and then rows are filled the same way from the middle to the sides of the matrix. An advantage of this solution is a simple implementation of decoders and routing of the signal going between cells and good results for accuracy.

Diodes 5 for the coarse conversion block 2, for canceling linear drifts on the wafer, are located outside the corners of this matrix, as shown in FIG. 5.

It is to be understood that although preferred embodiments, specific constructions and configurations, as well as materials, have been discussed herein for devices according to the present invention, various changes or modifications in form and detail may be made without departing from the scope and spirit of this invention. For example, the example given is for current sink DAC, but the polarity of the devices and of the current can be changed to create current source DAC. While negative logic an NOR-gates are used in the above for NMOS-type devices, positive logic and NAND-gates may be used for PMOS-type devices. Furthermore, particular embodiments for the current cells and the inside matrix logic have been shown, but other implementations are possible as well. For example, in the embodiments described, Nplus1 is derived from Nminus1, but alternatively Nminus1 can also be derived from Nplus1.

What is claimed is:

1. A two-dimensional matrix decoder for a digital-to-analog converter comprising an array of current cells, the cells having a current source means or a current divider means and a switching means, all cells being activatable in a pre-determined sequence, the matrix decoder comprising:
   a selection means outputting a first selection signal for selecting a cell,
   a cell state signaling means outputting a cell state signal determining whether a cell comes before or after the selected cell in the pre-determined sequence, matrix logic unit associated with each cell for generating a control signal suitable for controlling the switching means of that cell for switching current from the current source means or current divider means of that cell to at least one of a first node or a second node, the control signal being generated depending on the first selection signal and the cell state signal.

2. A matrix decoder according to claim 1, wherein the selection means comprises a first decoder outputting a first selection signal for selecting a first set of cells, and a second decoder outputting a second selection signal for selecting a second set of cells, the first and second set of cells having the selected cell in common.

3. A matrix decoder according to claim 2, wherein the first decoder is a row decoder and the first set of cells is a row of cells and the second decoder is a column decoder and the second set of cells is a column of cells.

4. A matrix decoder according to claim 1, wherein the first node is an output node of the digital-to-analog converter and the second node is a ground node or dummy node of the digital-to-analog converter.

5. A matrix decoder according to claim 2, wherein the first node is an output node of the digital-to-analog converter and the second node is a ground node or dummy node of the digital-to-analog converter.

6. A matrix decoder according to claim 1, wherein the pre-determined sequence is such that a sequence of cells starts in the middle of the array and expands from the middle to the sides of the array.

7. A matrix decoder according to claim 2, wherein the pre-determined sequence is such that a sequence of cells starts in the middle of the array and expands from the middle to the sides of the array.

8. A matrix decoder according to claim 1, wherein the control signal generated by the matrix logic unit is suitable for controlling the switching means of that cell for switching current to either of a first, a second or a third node.

9. A matrix decoder according to claim 2, wherein the control signal generated by the matrix logic unit is suitable for controlling the switching means of that cell for switching current to either of a first, a second or a third node.

10. A digital-to-analog converter comprising:
an array of current cells, all cells being activatable in a pre-determined sequence,
a current source means or current divider means and a switching means, and
a matrix decoder in accordance with claim 1.

11. A method for decoding a two-dimensional matrix for a digital-to-analog converter comprising an array of current cells, the cells having a current source means or current divider means and a switching means, all cells being activatable in a pre-determined sequence, the method comprising:

selecting a cell, determining whether a cell comes before or after the selected cell in the pre-determined sequence, controlling the switching means of the cell for switching current from the current source means or current divider means of that cell to at least one of a first node or a second node, the controlling depending on whether the cell is selected or whether it comes before or after the selected cell in the pre-determined sequence.

12. A method according to claim 11, wherein selecting a cell comprises selecting a first set of cells, and selecting a second set of cells, the first and second set of cells having the selected cell in common.

13. A method according to claim 12, wherein selecting a first set of cells comprises selecting a row of cells and wherein selecting a second set of cells comprises selecting a column of cells.

14. A method according to claim 11, wherein the pre-determined sequence is such that a chain of cells starts in the middle of the array and expands from the middle to the sides of the array.

15. A method according to claim 12, wherein the pre-determined sequence is such that a chain of cells starts in the middle of the array and expands from the middle to the sides of the array.

16. A method according to claim 11, wherein controlling the switching means comprises switching current to either of a first, a second or a third node.

17. A method according to claim 12, wherein controlling the switching means comprises switching current to either of a first, a second or a third node.

* * * * *